United States Patent [19]

Dingwall

[11] Patent Number: 4,783,643

[45] Date of Patent: Nov. 8, 1988

[54] IMPEDANCE TRANSFORMING CIRCUIT FOR MULTIBIT PARALLEL DIGITAL CIRCUITS

[75] Inventor: Andrew G. F. Dingwall, Princeton Township, Mercer County, N.J.

[73] Assignee: GE Company, Fairfield, Conn.

[21] Appl. No.: 104,405

[22] Filed: Oct. 5, 1987

[51] Int. Cl.[4] .............................................. H03M 1/06
[52] U.S. Cl. ................................................... 341/154
[58] Field of Search ................ 333/124; 340/347 DA, 340/347 DD Primary Examiner—William M. Shoop, Jr.
Assistant Examiner—Richard K. Blum
Attorney, Agent, or Firm—S. C. Corwin; H. I. Schanzer; B. E. Morris

[57] ABSTRACT

An impedance transforming circuit for multibit digital word signals includes plural transmission paths for respective signals of a word. At least some of the paths have different output impedances but present essentially the same signal propagation delay. Each path includes plural, tandem connected, transistor switches; and each switch comprises, with correspondingly located switches of other paths, a stage of the transforming circuit. Output conductances of the switches of a path are scaled along the path according to a stage-to-stage ration F selected to minimize the number of stages required to achieve a desired signal propagation time through the path. At any stage switch where the ratio F cannot be directly accommodated, the selected value of F is achieved by dividing the stage output conductance between an in-path switch, that satisfies that ratio F with respect to a driven stage and a dummy-load switch that, together with the in-path switch, satisfies the ratio F with respect to a prior stage switch.

13 Claims, 4 Drawing Sheets

FIG. 3

BINARY CODE BIT STATES

A7
A6
A5

63 64   127 128   191 192   255
DAC INPUT AMPLITUDE

FIG. 4

BAR CODE BIT STATES

B7A
B7B
B7C
B7D
B6A
B6B
B5A 63 64   127 128   191 192   255
DAC INPUT AMPLITUDE

IMPEDANCE TRANSFORMING CIRCUIT FOR MULTIBIT PARALLEL DIGITAL CIRCUITS

CROSS-REFERENCE TO RELATED APPLICATION

A copending application of A. G. F. Dingwall, Ser. No. 104,406, filed on even date herewith, entitled "Digital To Analog Converter With Switch Function Compensation," is related to this application and has a common assignee.

FIELD OF THE INVENTION

This invention relates to circuits for transforming output impedance of a signal supply circuit to an impedance level suitable for driving a predetermined different load impedance. More particularly, the invention relates to such a transforming circuit for multibit digital word signals in parallel signal transmission paths.

BACKGROUND OF THE INVENTION

Classical inductive impedance transforming devices are unsuitable for application to most semiconductor integrated circuit systems because they are too bulky. Their equivalent electronic circuits are relatively complex and, hence, too costly to implement for many application. Other active electronic circuits that might otherwise be utilized for impedance transformation, such as transistor emitter followers, involve problems such as dealing with transistor junction voltage offsets and relatively large emitter circuit resistors.

In certain systems there is a need to drive digital signals representing a multibit word in parallel from a source latch register with relatively high output impedance to a load with substantially lower output impedance. Such a situation can arise, for example, in circuits for converting between analog and digital signal formats, and in track-hold circuits.

It is known to use a tandem connected chain of transistor switches, such as complementary metal oxide semiconductor (CMOS) transistor switches, for impedance transformation in a single signal transmission path. However, if a plurality of such switch chains are provided in an impedance transformation matrix such as would be required for multibit signal transmission in parallel signal paths, various transistor characteristics have been found to give rise to usually intolerable differential signal propagation delays among the chains as well as undesirable utilization circuit operating phenomena.

SUMMARY OF THE INVENTION

In one embodiment of the invention, the impact of the foregoing differential delay and other effects is reduced by employing a plurality of chains of tandem connected transistor switches for impedance transformation and including equal numbers of transistor switches in the signal transmission path of each chain. The states of the switches in a chain are controlled by the binary signal states of input signals applied thereto in their respective chain transmission paths Real portions of the switch output impedances are substantially uniformly scaled along the chain.

In accordance with another embodiment of the present invention, a driven stage output conductance to driving stage switch output conductance scaling factor F is employed throughout all of the plural chains of switches. At any stage pair of a chain where the factor F would otherwise need to be a value less than the chosen value for uniform use in all stage pairs, the output conductance of the driven stage of the pair of switches is split between an in-path switch and at least one dummy-load switch. The conductance of the in-path switch is set to yield the correct value of F for the combination of the in-path and dummy-load switch conductances with respect to the conductance of their driving switch in the prior stage of the same chain.

In at least those applications where complementary conductivity type transistor switches are employed and a high degree of precision is required in an analog version of the impedance-matched digital word signals, an even number of switch stages are employed. In that way, any lack of output conductance symmetry presented by the respective conductivity types of transistors of each switch used will be offset in the course of signal propagation through its entire chain of switches.

Likewise, in those higher precision applications, the at least one dummy-load switch comprises at least two tandem switch stages conforming to the chosen factor F so that the first of the tandem dummy-load switches is properly loaded.

BRIEF DESCRIPTION OF THE DRAWINGS

A more complete understanding of the invention can be obtained from a consideration of the following Detailed Description taken in connection with the appended claims and the attached Drawings in which:

FIGS. 3 and 4 show signal state diagrams illustrating the operttion of the binary-to-bar decoder of FIG.2;

DETAILED DESCRIPTION

Figure 1:
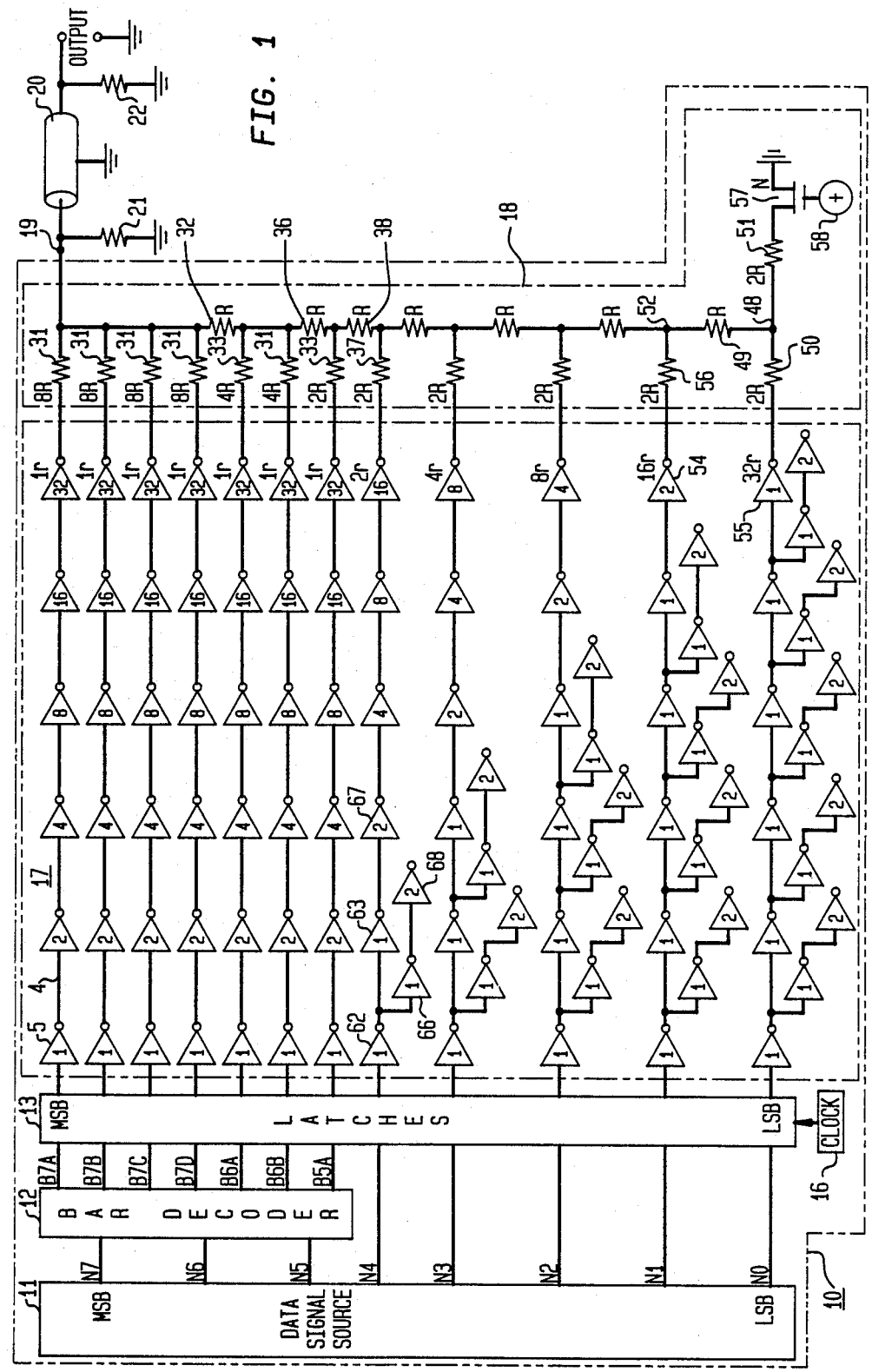
FIG. 1 shows a digital to analog converter circuit in accordance with the invention.

Referring now to FIG. 1, there is shown a digital to analog converter (DAC) IO to illustrate one application of the impedance transforming circuit 17 which is in accordance with one embodiment of the present invention. Individual major blocks of the DAC 10 will be described briefly to show their interrelationship in the DAC environment, and thereafter those blocks will be discussed individually in greater detail to demonstrate certain features and advantages of the invention.

DAC 10 includes a data signal source 11 of any convenient type providing ground reference, multibit, digital signals in bit-parallel, binary code, word format. Illustratively, 8-bit words, herein sometimes called "samples" or "sample values," are employed and include the parallel signals N0 through N7 in increasing order of binary significance. A binary-to-bar decoder 12, hereinafter simply a bar decoder, is also ground referenced and couples two or more, illustratively three, of the most significant bits (MSB) in the output of source 11 to a set 13 of latches. The nature and purpose of decoder 12 will be further discussed subsequently. Latch set 13 includes one ground referenced, latch circuit, such as the well known D-type flip-flop circuit, for each of the seven parallel output bits of decoder 12 and for each of the five least significant bits (LSB) of the input signal from source 11. Periodic signals from a clock signal source 16 are applied to the inputs of the latch circuits to cause them to sample simultaneously their respective inputs form source 11 or decoder 12. Each of the latch circuits has essentially the same output impedance, and that is typically 500 ohms or more.

Latch circuits of the set 13 function as input connection circuits for a set 17 of transistor switch chains employed for impedance transformation. Outputs of the latches are coupled through respective chains of the set 17 to an output connection circuit, illustratively the respective rung input connections of an R-2R resistance lader network 18. Each chain, such as the chain 4, includes plural transistor switches, illustratively inverting switches such as a switch 5 in FIG. 1, connected in tandem to form a transmission path for asynchronous propagation of signals of one bit position from the latch set 133 to network 18. As will be shown, it is presently preferred to employ for the respective switches complementary metal oxide semiconductor (CMOS) inverting switches. However, one or more of the switches in a chain can be implemented in other forms of logic switches such as NAND, NOR, or transmission gates.

The network 18 converts the received bit-parallel digital signal words to corresponding successive analog signal samples or values, which appear at an output terminal 19 of the digital to analog converter. Although network 18 is basically of the well-known R-2R configuration, it includes modifications, to be described, to accommodate both improved converter linearity and the bar decoder 12 function.

Signals at terminal 19 are coupled through a transmission line such as a doubly terminated coaxial cable 20 to an output, or utilization, circuit (not shown). Typical utilization circuits requiring the speed and precision of a wide-bit, low-output-impedance DAC driving through a coaxial cable include robotic-type applications for machine control and couplings of telemetering precision data from remote locations. Terminating resistors 21 and 22 connect the input and output ends, respectively, of cable 20 center conductor to ground and have resistance values of, e.g., 75 ohms for cable of that characteristic impedance.

Returning to a consideration of the bar decoder 12, it is provided to reduce certain analog output signal distortion effects arising from the employment of transistor switches in the switch chain set 17 and to reduce the amount of semiconductor area required to implement the switch chains as compared to impedance transformation for fully binary coded signals. The mentioned distortion reduction results from a reduction in the number of switches in the final stage of chain set 17 that must change state under worst-case conditions, i.e. at the binary code representation transmission across the midrange level of the DAC. The inverting, CMOS transistor switches illustratively employed are known to be subject to certain nonsymmetrical switching characteristics, to be subsequently further discussed. Those nonsymmetrical characteristics can cause undesirable, signal level transmission time, amplitude excursions in converter analog output. Oftentimes the DAC must operate with respect to digital signals with such high word rates that effects of those excursions consume a significant part of each sample time before dissipation and thus cause undesirable distortion in the analog output. A word rate in the tens of megahertz range, e.g. forty million words per second, is such a high word rate when using CMOS switches characteristic of the present state of the art.

The impact of the transmission time excursion effects just mentioned is advantageously reduced by decoding at least some, illustratively three, of the most significant bits of signals from source 11 to a so-called "bar" format to minimize the numbers of bits which change state at any given time when input information is sequencing through its range of possible values. The major changes in current supplied to output terminal 19 occur at the three, binary coded, most significant bit positions. For any given step change in analog signal at terminal 19, the contributing final stage switches of chain set 17, in the bar coded positions corresponding to those three binary coded bit positions, are all sources or all sinks, rather than being a combination of sources and sinks as would have been the case in the absence of bar coding, i.e. with binary coding. This is evident from the diagram of FIG. 4 which shows that any increase in DAC input amplitude which involves bar coded bits requires one or more bits to go high, i.e. sourcing current. Similarly, a decrease in input amplitude requires one or more bits to go low, i.e. sinking current. By contrast, in the binary coded version of those same three bits, all three change state at the same time for an increase passing through the midrange point of the sequence; and they provide to output terminal 19 the difference between one source current and two sink currents as shown in FIG. 3. The bar code resembles a cycle of the output of the well known twisted ring counters, or Johnson counters or Moebius counters All are characterized by a sequential pattern of signal states in which, starting from a least significant all-ZERO pattern, an all-ONE pattern of growing size appears to move form the LSB position toward the MSB position.

Figure 2:
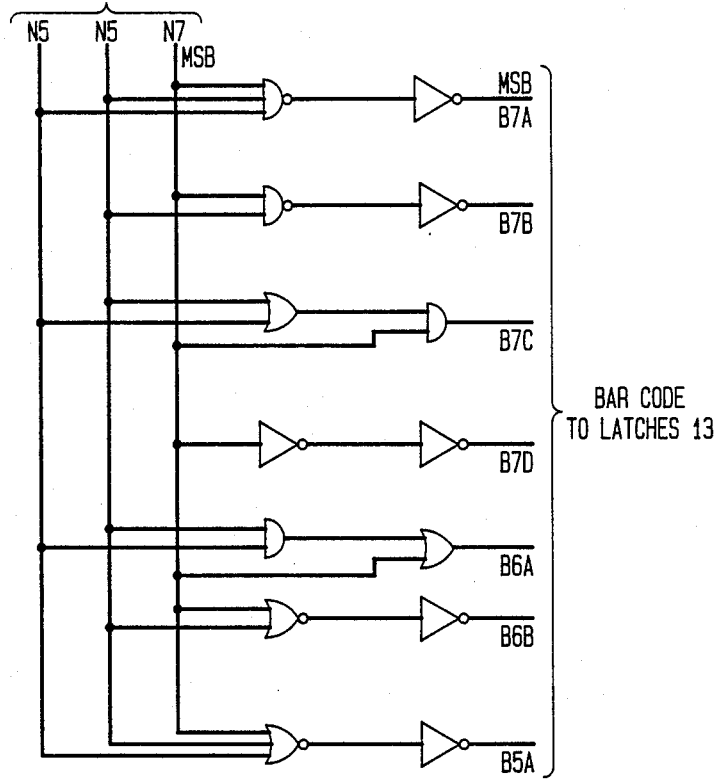
FIG. 2 shows a logic diagram of a binary-to-bar decoder circuit useful in the converter of FIG. 1.

FIG. 2 depicts a schematic diagram of one form of logic circuit for implementing the decoder 12 to decode the binary coded bits N5, N6, and N7 into the seven corresponding bar coded bits B5A, B6B, B6A, B7D, B7B, B7A (in ascending order of significance). The two stages of logic are utilized for each bar coded bit to assure essentially equal signal propagation delay among all bit circuit paths of the decoder. Triple-digit reference characters are employed for the bar coded bits to facilitate association of the bar coded bits with respective treatments of their corresponding, binary level, rung circuits in ladder network 18.

Boolean-type expressions for each bar coded bit derivation, in ascending order of bar coding significance and which also describe the logic circuit of FIG. 2 are:

$B5A = A7 + A6 + A5$
$B6B = A7 + A6$
$B6A = A7 + (A6 + A5)$
$B7D = A7$
$B7C = A7 \cdot (A6 + A5)$
$B7B = A7 \cdot A6$
$B7A = A7 \cdot A6 \cdot A5$.

FIGS. 3 and 4 are signal state diagrams illustrating the binary coded bit state inputs to decoder 12 and the bar coded bit state outputs from the decoder, respectively, each with respect to DAC input amplitude sample values. It can be seen in FIG. 4 that, in the bar code pattern for any sample value, any ONE bits are all together and any ZERO bits are all together. No more than one transition between ONE and ZERO bit states is found in any given sample value representation, and there is only one bit state transition involved in changing from one value to an adjacent value in the sequence of values that can be represented. Note in particular, that at the worst case (for binary), midrange transition between values of 127 and 128 for the illustrative 8-bit example, the only bar coded bit that changes state is the bit B7D. Of course, if the input sample value could change between two successive sample times from 31 (all ZEROs) to 255 (all ONEs), seven bar coded bits would change state in the one operation while only three binary coded bits would change state in the one operation. However, in systems requiring multibit, signal, impedance transformations of the type here described, bandwidth limitations usually prevent large excursions from occurring which would involve a single-step analog sample level change that would involve more than one sequential level step in the bar code sequence for the more significant three binary coded bits of the digital input.

As previously mentioned, the set 13 of latches includes twelve clocked D flip-flop circuits (not separately shown). Each such flip-flop has a data input connection, a clock input connection for activating the flip-flop to sample the signal at its data input, and true and complement output connections, only the true output connections being utilized in the set 13. Each of those flip-flop circuits presents an output impedance having a real, or conductance, part which is typically on the order of 500 ohms. However, a low resistance ladder network, that does not require an amplifier to drive a doubly terminated coaxial cable, must exhibit a much smaller output impedance in order to drive the cable without significant reflection problems resulting from the impedance mismatch. That low resistance network must in turn be driven from correspondingly low output impedance sources for its individual rungs, i.e. impedances which will not destroy the essential DAC linearity of monotonic operation. Consequently, the set 17 of CMOS switch chains is provided to develop the necessary current level for driving respective rungs of the low resistance ladder with substantially equal signal propagation delays through the respective chains. The equality of propagation delays is essential in order that all final stage switches will operate at essentially the same times.

Before discussing the switch chains further, it is useful at this point to discuss the resistance ladder network 18 in somewhat greater depth. Network 18 is basically a conventional R-2R ladder network with certain modifications to accommodate employment of the bar coder 12. In such a network ladder rail resistors of relative resistance R are connected in series between the network analog output terminal 19 and ground, one such rail resistor is included in the series connection between rung resistor connection points thereto for each adjacent pair of input binary coded word bit signals to the DAC. In addition, and as usual for R-2R ladder networks, a resistor of 2R value is included between the least significant rail resistor R and ground.

Each ladder rung relative resistance 2R is realized as one or more resistors connected to a common circuit point in the rail series connection. Each binary coded digital input is applied through a ladder rung resistance of relative resistance 2R connected to a rail resistor terminal that is the more remote electrically from ground of the two rail resistor terminals. In an application wherein each of the terminating resistors 21 and 22 of cable 20 is 75 ohms (corresponding to a static load of 37.5 ohms with 75 ohm terminations at both ends of cable 20), ladder rail resistance R is about 150 ohms, rung resistance 2R is 300 ohms, and a reference voltage supply is five volts, the ladder network presents a full-scale voltage of 1 volt to the doubly terminated 75 ohm cable 20.

It can-be seen in FIG. 1 that the seven bar coded bits are adapted into the ladder weighting scheme by employing plural parallel circuit resistors to make up the effective 2R rung relative resistance in certain cases. Those resistors are considered to be in parallel circuits in an equivalent circuit sense because each is at all times connected through one or the other of its driving switch transistors and reference supply connections to ground return. Thus, the four most significant bar coded bits B7A through B7D appearing at the output of chain set 17 are coupled through four rail resistors 31, each of resistance 8R, which are all connected to the rail resistor series circuit combination at the same electrical point, i.e. adjacent to output terminal 19 and at the top (as illustrated) of rail resistor 32. Similarly, the bar coded bit group B6A and B6B appearing in the output of chain set 17 are connected through two rung resistors 33, each of resistance 4R, to the rail resistor series circuit combination at a common electrical point between rail resistors 32 and 36. Finally, the single-bit bar coded bit group B5A appearing in the output of chain set 17 is connected through a normal rung resistor 37, of resistance 2R, to the rail resistor series circuit combination at a common electrical point between rail resistors 36 and 38. It can now be seen that the ladder network R-2R resistance relationship for the addition of the bar coding feature is unchanged from what it would have been had all eight of the input binary coded bits been applied without the intervening bar coding shown.

Manufacturing tolerance on individual resistors of a low resistance, R-2R, latter network is not critical as long as the R-2R ratio between rung and rail resistances is precisely maintained. That ratio is usually relatively easy to maintain in integrated circuit manufacturing processes, but it is disturbed if the output impedances of switches connected for driving the ladder rungs include resistances that are significant in terms of the ladder rung relative resistance $2R=300$ ohms value. MOS transistors used in the example have maximum conducting resistances of 5 to 20 ohms that are still significant compared to the aforementioned 300-ohm rung resistance when overall linearity of better than one part in 512 is needed for 8 bits. In the example where $2R=300$ ohms, the maximum resistance, LSB switch 55 has a relative resistance 32r. That relative resistance 32r should be of the same order of magnitude as $2R=300$. In the present example, switch resistance of up to 20 ohms can be used with no significant loss of accuracy.

Figure 5:
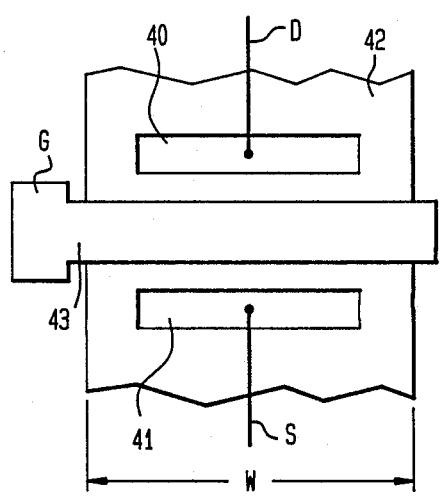
FIGS. 5 and 6 show top and end views, respectively, of CMOS transistor, inverting, switch illustratively employed for implementing the present invention.
Figure 6:
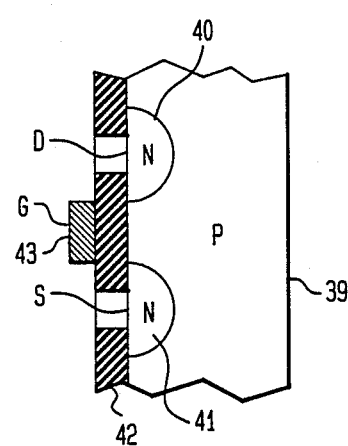

In FIG. 1, each rung resistor of ladder network 18 receives either a predetermined current level or a low impedance ground connection (zero current level), depending upon digital signal information state according to either the binary or bar code employed, in order to produce proper overall DAC operation. So there is a switch resistance in series with each rung circuit resistor at all times of DAC operation. That switch resistance, for the CMOS transistors illustratively employed, is a function of transistor device width W, i.e. gate terminal width. The wider the gate terminal overlying device semiconductor material, the smaller is the device conducting resistance r, and the larger is the device conductance G. FIGS. 5 and 6 illustrate that width dimension in relation to a typical MOS transistor, and FIG. 7 shows such transistors connected in inverting switches in a tandem connection.

FIGS. 5 and 6 are familiar top and end views, respectively, of metal oxide semiconductor transistor using P-type conductivity material for the body 39 of the transistor and having two adjacent N-type material diffusions 40 and 41, i.e. drain and source diffusions. A layer 42 of insulating material overlies the diffusion side of the device and has windows therethrough for drain and source leads to the respective diffusions. A gate metallization 43 on a portion of insulating material, not shown but comprising for example silicon dioxide material, surrounds the transistor body to define the device width W which determines device conducting resistance and the various device parasitic capacitances. Those resistances and capacitance values are utilized to advantage in configuring the chain set 17 to achieve impedance transformation with different output impedances but essentially equal signal propagation delays. An N-type transistor has the same appearance as shown in FIGS. 5 and 6 but the locations of P-type and N-type materials are interchanged.

Figure 7:
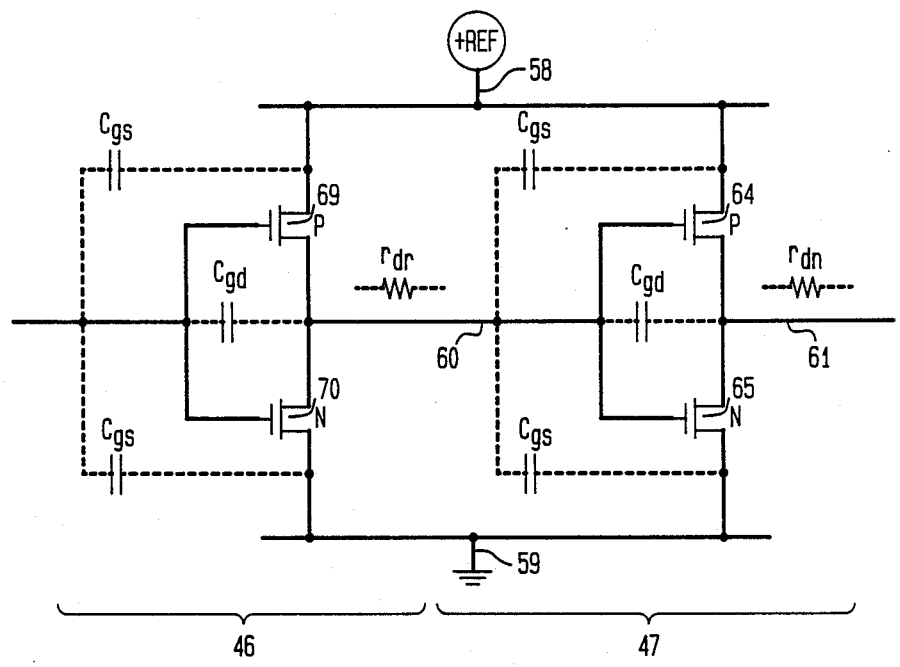
FIG. 7 shows a CMOS switch circuit pair as illustratively employed in the converting circuit of FIG. 1.

FIG. 7 illustrates an arbitrary pair of CMOS switches 46 and 47 of the type illustratively employed in chain set 17. The switch 46 includes a P-type transistor 69 and an N-type transistor 70 connected in series; the second pair of switches includes a P-type transistor 64 and an N-type transistor 65 connected in series. Complementary bipolar transistors could be substituted for the CMOS transistors. The two switches are further connected by leads 58 and 59 between a positive reference voltage supply +REF and ground. That reference supply and ground are included in each switch schematic representation in the set 17 of FIG. 1. Parasitic gate-source and gate-drain capacitances $C_{gs}$ and $C_{gd}$, respectively, and the conducting resistance portions $r_{dr}$ and $r_{dn}$ of the output impedances of the illustrated driving switch 46 and driven switch 47, respectively, are schematically indicated with dashed lines in FIG. 7. As indicated with respect to switch 47, the signal input to each switch is provided by way of a lead 60 to the transistor gate terminals in parallel; and the output is provided by way of a lead 61 from the transistor drain terminals in parallel.

Input signals to a switch are presented with the high essentially open-circuit, input resistance of the switch transistor gate terminals and have either a high or a low binary signal state compared to the reference voltage. A high signal state turns on the N-type transistor and turns the P-type transistor off. Those conduction states place output lead 61 at ground if the switch is driving another switch of at a slightly positive voltage, corresponding to the voltage drop across the internal conducting resistance r of the conducting transistor, if the switch is driven a ladder rung resistor. A low input signal state turns the P-type transistor on and the N-type transistor off. Those conduction states place output lead 61 at the reference voltage level if the switch is driving another switch or at a slightly less positive voltage corresponding to the voltage drop across the resistance of the conducting transistor if the switch is driving a ladder rung resistor.

It is noted here for further reference that it is well known that since PMOS and NMOS transistors are manufactured by somewhat different processes that their respective conducting resistances are often slightly different. The difference is uniform throughout a manufacturing batch, of devices and all transistors of any given chip in the batch, but it cannot be forecast for a given batch whether the PMOS or the NMOS transistors will have the larger conducting resistance. The total output resistance r of an MOS transistor also varies directly, and the conductance G inversely, with the transistor gate width W. Likewise the transistor capacitances $C_{gs}$ and $C_{gd}$ also vary directly with the transistor gate width W.

Turning now to a more detailed look at the ladder operation in relation to the switches driving respective rungs, the static effect of switch resistance on the R-2R ratio precision will be considered. For a linear ladder conversion function, and neglecting switch resistance for the moment, the resistance looking down the ladder from a rail terminal, such as terminal 48 in FIG. 1, toward the grounded end of the ladder is the effective resistance of a pair of rung sized resistances 2R, i.e. resistors 50 an 51, in parallel. The effective resistance can be expressed in the form $$R_{e48} = \frac{(R_{50}) \times (R_{51})}{(R_{50} + R_{51})},$$

which reduces to a rail resistance value $$R_{e48} = R$$

because the respective resistors 50 and 51 are equal. Backing up the ladder one step, a new effective resistance seen from a terminal 52 takes form $$R_{e52} = \frac{(R_{56}) \times (R_{49} + R_{e48})}{(R_{56} + [R_{49} + R_{e48}])},$$

which reduces to a rail resistance value $$R_{e52} = R$$

because the sum of the old effective resistance $R_{e48}$ and the resistance of R is equal to a rung resistance 2R and to the resistance of resistor 56. Similarly, effective resistances at other rail terminals, including output terminal 19, and ignoring switch output resistance, equal R.

The conducting resistance r, i.e. the real part of the switch output impedance, of the largest-width practical switch in the present state of the art is about 1 to 3 ohms. That value is clearly significant in relation to the aforementioned illustrative rung resistance 2R of 300 ohms. It has been found that the linearity of ladder function is adversely affected by such significant switch resistances which distort the required R-2R relationship. However, it is hereinafter shown that the adverse effect can be substantially reduced by proper, compensating, circuit configuration.

One compensation step is to connect in the ladder rail, between resistor 51 and ground, an N-type transistor 57 with conducting resistance $r_{57}$ equal to the conducting resistance $r_{55}$ of the chain final stage switch 55 which drives rung resistor 50. The gate terminal of transistor 57 is permanently biased by a positive supply 58 of the same voltage as that used to turn on N-type transistors of the switches in FIG. 6. This makes the effective resistance parallel combination $R_{e48}$ include equal total, i.e. effective, rung resistances each including a like switch resistance, which like switch resistance is here for convenience also designated $r_{48}$ to associate it with the rail terminal from which that effective resistance is viewed for the least significant rung. Accordingly, the total effective resistance $R_{e48}$ seen from terminal 48 toward ground now becomes $$R_{e48} = \frac{(R_{50} + r_{55}) \times (R_{51}1 + r_{57})}{(R_{50} + r_{55}) \times (R_{51} + r_{57})}$$

However, since $R_{50}=R_{51}=2R$ and $r_{55}=r_{57}=r_{48}$, $R_{e48}=(R+r_{48}/2)$.

Then, backing up the ladder once again to terminal 52, it can be seen that to preserve the resistance symmetry in the parallel combination of resistors in the effective resistance $R_{e52}$ seen looking along the ladder, the resistance of the switch 54 connected to rung resistor 56 must have a value equal to the switch resistance component $r_{48}/2$ in the effective resistance at terminal 48. The switch resistance in series with the rung resistor 56 then must be $r_{48}/2$, and the new effective resistance $R_{e52}$ at terminal 52 is $R_{e52}32 R + r_{48}/4$.

The foregoing switch resistance scaling algorithm is also recurrently applied for determining what the switch resistance should be for each switch that drives a rung relative resistance of 2R. The result is that the relative resistance values for switch resistance decrease by half at each more significant rung position, and the symmetry of the effective parallel resistance calculation is maintained at each step along the ladder network 18.

The range of switch resistance values that are practical is limited at one extreme by the resistance of the widest switch that it is practical to employ in an application. Two factors determining the practicality are semiconductor material area used and the manufacturing difficulties involves in forming sufficient individual large transistors on a chip. At the other extreme the range is limited by the resistance of the smallest switch that it is practical to manufacture. In FIG. 1, application of the switch resistance scaling algorithm is indicated by reference characters of the from "—r" adjacent to respective switches, e.g. switches 54 and 55, that are connected to ladder network resistors. An arabic numeral in the blank to the left of the "r" indicates the relative size of the resistance compared to resistances of other switches in the final stage of set 17. In that form of designation, "1r" is a unit resistance equal to the resistance of the switch having the smallest resistance, i.e. the widest gate, that is practical to be used and to allow doubling of that value at each less significant ladder rung switch until a level is reached, within the mentioned range, for the LSB rung switch. Thus, in FIG. 1, the switch 55 for the LSB rung has as the real part of its output impedance, i.e. its output resistance, the resistance 32r. The switch 54 at the next more significant rung has the output resistance 16r, and so forth up the ladder halving the rung driving switch output resistance at each step until reaching the switches for the bar coded bits.

Among the bar coded bits, all of the switches driving into ladder network resistors have the resistance 1r. The employment of a common switch size for all bar coded bits results from the previously described treatment of those switches in the ladder network. That is, the least significant bar coded bit B5A has the unit output resistance 1r as the natural culmination of scaling switch resistances in binary coded bit position, and it drives a single rung resistor of value 2R. The bar coded bits B6A and B6B drive parallel connected rung resistors of twice the usual size, i.e. 4R; and in accordance with the scaling algorithm their respective two drive switches must hav a combined switch output resistance of 1r/2, i.e. onehalf of the switch resistance 1r at the bit B5A switch. Thus, the rung driving switches for the B6A and B6B bar coded bits must individually have output resistances of 1r each to exhibit a combined switch resistance of 1r/2 in the parallel combination. Similarly, the bar coded bits B7A through B7D drive into parallel connected rung resistors of four times the usual rung resistor size, i.e. 8R; and their respective four drive switches have a combined switch output resistance of 1r/4, i.e. one-half of the switch resistance 1r/2 at the bit B6A and B6B switches, so that their individual switch output resistances are all the unit value 1r.

Because of the scaling of ladder rung, driving switch resistances as just described, the ladder produces essentially linear digital conversions. That is, over the full range of values that can be represented by the eight input binary coded bits N0–N7 from source 11, each incremental change in value represented by those binary coded bits causes a corresponding incremental value change, in the same direction, in the DAC analog terminal 19. It is useful to note here that if bar coding were not employed the range of switch resistance values that would be needed for proper scaling would extend from 1r to 128r for the seven- bit binary coded digital signals provided from source 11; and that larger range of switch output resistances means that much greater semiconductor material area would be required to implement those driving switches and their associated switches in their respective switch chains of the set 17.

The set 17 of switch chains will now be considered in greater depth. Although switch resistance scaling, as just described, at the rung driven point preserves ladder linearity of operation, the different rung drive switch conductances that result necessarily have different associated parasitic capacitive effects. So the switches exhibit different dynamic operating characteristics that produce non-negligible effects on the outputs of the chains as will be described.

A first of the dynamic operating characteristic differences is that of time constants of switch operation resulting from different switch conductances. The different time constants cause correspondingly, different, signal propagation delays among the chains of set 17. Plural stages of switches are provided in that set to achieve a desired impedance transformation from essentially uniform driving source output impedances, for the bit signals of a digital signal word, to substantially lower and different transformed output impedances for those signals. Furthermore, the transformation must be accomplished without unduly slowing operation of the transformation and without incurring objectionable levels of spurious signal excursions in the transformed output. The set of chains then is a matrix of switches that may have different output conductances across the chains within any given stage and along any given chain. Those different conductances have associated therewith corresponding different parasitic capacitances which have the effect of different time constants of switch operation throughout the matrix of switches. The different time constants tend to cause unequal propagation delays among the respective chains and hence noncoincident operation of output stage switches of the set. Noncoincident switch operation within a stage produces various difficulties in circuits driven by the set 17; and, in the case of a DAC, those difficulties include distortions of the analog output from the linear output that should be faithfully produced.

In FIG. 1, an equal number of stages are employed in each switch chain to provide a coarse assurance of equal delays among the chains of switches. Embodiments using CMOS inverting switches employ an even number of stages of such switches to lend a tendency to offset some lack of conductance symmetry inherent in manufacture of complementary conductivity types of transistors used in each switch. The asymmetry gives rise to corresponding, operating, time constant asymmetry that averages out over an even number of stages of inverting switches.

Further, output conductance portions of switch output impedances in each chain are scaled along the chain to achieve a uniform stage-to-stage ratio F of output conductances so that the desired impedance transformation can be realized with a minimum number of stages for the signal propagation rate desired. The uniform ratio F equalizes switch operating time constants and, thus, equalizes propagation delays among the channels. In algebraic terms, $$F = G_{odn}/G_{odr}$$

where $G_{odn}$ and $G_{odr}$ are the output conductances of a driven stage and a driving switch, respectively, in a switch chain. Arabic numerals are shown within the triangular representation of each switch in the set 17 to indicate the overall picture of the scaling in the set. It will be immediately observed that the in-chain conductance scaling starting point is established by the aforementioned resistance scaling across the output stage of set 17 to network 18. Thus the bar coded switches in that final stage all have the unit output resistance 1r and so have the largest conductance indicated by the number 32 in the switch representation. From that point the final stage switch resistances scale up to 32r, and the corresponding final stage conductances scale downward to the unit conductance 1 in switch 55.

The exact value of the ratio F to be used is not critical, and it can be different for different applications of the chain set 17. High values of F tend to cause larger glitches, i.e. unwanted analog output signal excursions in a digital to analog converter as will be further discussed. At low operating speeds, where a glitch can dissipate within a part of a sample interval, the size of the glitch is less of a problem. For slow speed operation, e.g. about one megahertz, values of F near 10 would be satisfactory. It has been found that a value of two works well for the illustrative embodiment in which the set 17 is part of a DAC that operates at a sample rate of about 40 megahertz. As indicated by the numerals in the switch representations in set 17, all of the switches in the bar coded chains adhere to the ratio F=2 for scaling output conductances downward from 32 at the output stage, through the four intermediate stages, to 1 at the input stage of the set. If bipolar transistor switches are employed, the value of F will be higher than that for CMOS switches for any particular application.

Since all input stage switches, e.g. switch 5, in set 17 advantageously are assigned the unit conductance 1, something must be done in the chains for binary coded bit positions to permit adherence to both the uniformity of use of the ratio F=2 and the conductance (resistance) scaling across the output stage previously described That difficulty is resolved in a chain at any stage pair, e.g. at switches 62 and 63 in the chain of bit N4, where it appears that application of the ratio F to switches in the transmission path of the chain would not otherwise conform to F. The solution requires providing a dummy load switch 66 addition to the driven stage and splitting the conductance of that stage between the in-path switch 63 and the dummy load switch 66. The dummy load switch 66 has its input connected to be driven in parallel from the switch 62, but its output drives no other in-path switch of the same chain transmission path. In some cases, to be described, the dummy-load switch is provided with its own switch load but not in the chain transmission path between chain input and output. As can be seen in FIG. 1, the output conductance of the switch 63 conforms to the ratio F=2 with respect to its driven switch 67; and the total output conductance of the chain stage of switch 63, i.e. conductances of switches 63 and 66, conforms to the ratio F=2 with respect to its driving stage switch 62. This technique of applying dummy-load switches is applied in the same manner, as many times as may be necessary in any given chain; and it is evident that it is used five times in the chain of LSB switch 55.

In some applications additional precision in operation of the chain set output stage is required, and that is provided by adding a further switch stage, i.e. a switch 68 driven by switch 66, to each dummy load switch. The reason for this is that the speed of switch operation depends in part on the capacitance of its load. Therefore, to fix precisely the loading on switch 62, its driven switches 63 and 66 are both loaded substantially the same. Additional loading on switch 68 for still further precision can also be accomplished, but it is usually not required.

Another dynamic operating characteristic, after the different time constant effect, arises from the fact that, again as a result of manufacturing process differences, the NMOS and PMOS transistors in each switch usually switch at significantly different rates; and one cannot forecast which will be the faster in any one manufacturing batch of devices. The result of the switching time difference is evident at the outputs of the final stage switches of the chain set 17 where transistors of a switch exchange, so to speak, conduction states on each switch operation. That exchange modifies significantly the currents flowing through the ladder network 18 and the analog output terminal 19. The worst case occurs at the time of a digital word value change at the midpoint of the total DAC range, illustratively between values of 127 and 128, because in an all-binary-coded representation all eight of the switches must change state, the most significant switch changing 128 units of current in one direction, i.e. ON or OFF, and the seven less significant switches together changing 127 units of current in the other direction, i.e. OFF or ON. It is noted that in a switch, e.g. 47 in FIG. 7, if 47 is assumed to be a final-stage switch, the P-type transistor 64 "sources," i.e. supplies, a current from reference supply lead 58 to lead 61 when the transistor turns ON for conduction. The N-type transistor 65 "sinks" a current to ground connection lead 59 from switch output lead 61 when the transistor turns ON for conduction. A positive signal at lead 60 turns ON the N-type transistor 65 and turns OFF the P-type transistor 64. A ground signal at lead 60 turns OFF N-type transistor 65 and turns ON P-type transistor 64.

Figure 8:
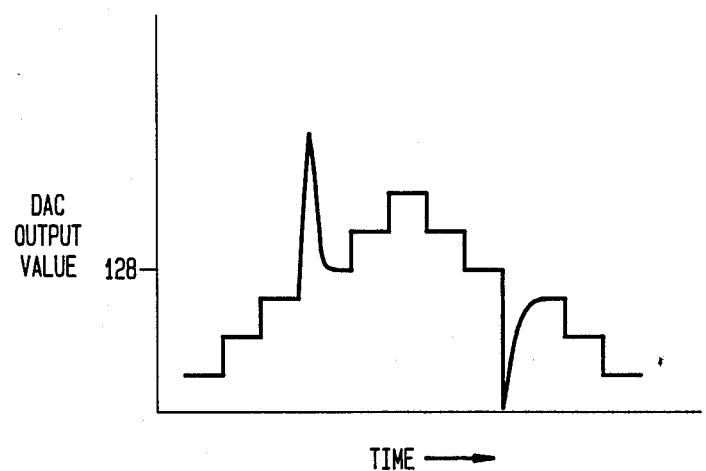
FIG. 8 shows a wave diagram illustrating a digital to analog converter analog output with superimposed amplitude excursions resulting from nonsimultaneous operation of switches coupling digital signals to the converter resistance ladder circuit.

If the two types of MOS transistors switches were initiated at the same time, the transient effects would tend to cancel and any remaining noise differential would be tolerable. However, the real-life transistor types have different switching rates; and the transistor, or transistors, that turn ON a large number of units of DAC output current in any one sample time may cause a large transient time analog signal excursion, e.g. eight or more times a single LSB-sized excursion, that requires a major portion of a signal sample time before it dissipates. Such an excursion, sometimes called a "glitch," for the illustrative transition in either direction between 127 and 128 for a fully binary coded word is illustrated in FIG. 8. The end effect of such an excursion depends upon the direction of the transition and the type of utilization circuit coupled to cable 20 output, but it at least substantially modifies the average analog signal form the true digital input sample value that should prevail. In the case of video signals being coupled to a display device, the effect can be a bloom of brightness or an unnatural increase or decrease in intensity at dividing lines between displayed objects of supposedly similar colors. Bar decoding of two or more of the most significant bits before coupling through the chain set 17 substantially reduces the number of set 17 final stage switches that must turn on for the worst case midrange transition time and for other major binary information transition times. That reduction has been found sufficient to eliminate the mentioned video display effects of the switch operation and sufficient to reduce the change in average analog signal value to tolerable levels for most applications of the DAC.

Although the invention has been described in connection with a particular application thereof, it is to be understood that it can be usefully employed in other applications where different logic paths are required for actuation of respective switches and, although the switches need not always operate together, when they must operate together they must do so at very nearly the same time.

What is claimed is:

1. An impedance transforming circuit for multibit digital word signals in separate transmission paths and comprising:
    an input connection circuit of a first output impedance for each of said bit transmission paths;
    an output connection circuit to which said paths each presents a second, much lower, output impedance;
    in each of said transmission paths, a chain of tandem connected electrical switches the states of which are controlled by the binary signal state of a digital signal applied thereto in such path;
    means for coupling said chains of switches between said input connection circuit and said output connection circuit;
    each of said chains includes an equal number of said switches in its tandem connected switch, transmission path for transmitting signals with substantially the same propagation delay; and
    said tandem connected switches of said each chain have the real portions of their switch output impedances substantially uniformly scaled along such chain to accomplish said impedance transformation between said first and second output impedances.

2. The impedance transforming circuit in accordance with claim 1 in which said output impedances of at least some of said transmission paths are different from such impedances of others of said transmission paths.

3. The impedance transforming circuit in accordance with claim 1 in which said at least some transmission paths have resistance portions of their output impedances scaled in a binary weighted fashion of decreasing binary weighting for ones of such paths of increasing binary significance.

4. The impedance transforming circuit of claim 3 further comprising:
    a plurality of additional ones of said transmission paths, hereafter a plurality of paths, have output impedances with equal resistance portions; and
    said plurality of paths are divided into at least two groups having binarily weighted numbers of paths in the respective groups whereby the combined parallel resistance portions of output impedances of the paths of each group conform to different extensions to said binarily weighted resistance scale.

5. The impedance transforming circuit in accordance with claim 1 further comprising in each of said switches:
    an output connection;
    an input connection for receiving a digital signal in one of said transmission paths to control the operation of such switch in either direction between first and second switch states;
    first and second voltage supply connections for receiving first and second voltage values; and
    means, responsive to digital signals at said input connection, for coupling said output connection to said first supply connection in said first switch state and for coupling said output connection to said second supply connection in said second switch state.

6. The impedance transforming circuit of claim 5 further comprising in said coupling means;
    first and second complementary metal oxide semiconductor transistors of different conductivity types, respectively, each transistor having source, gate, and drain terminals;
    means for connecting gate terminals of said first and second transistors to said input connection of said each switch for biasing only one or the other of said transistors into conduction in response different levels, respectively, of said input digital signals;
    means for connecting source-drain paths of said transistors in series between said supply connections; and
    means for connecting said drain terminals of both of said transistors to said output connection of said each switch for providing at said output connection an inverted version of signals at said input connection.

7. The impedance transforming circuit of claim 6 in which each of said switches has a predetermined sequential location in the tandem connection of its transmission path and each group of correspondingly located switches in that sequence comprises a different stage of switches; and
    each of said chains includes an even number of said switch stages.

8. The impedance transforming circuit of claim 1 further comprising:
    correspondingly located switches in respective ones of said chains comprise a stage of said impedance transforming circuit;
    output conductances of said tandem connected switches of said each chain are scaled to realize a uniform ratio F of (a) output conductance of a driven stage in the chain of said each path to (b)

output conductance of a prior stage switch driving that driven stage; and at any stage of a chain where a conductance ratio between a driven stage and a driving switch for that stage would be different from F, said driving stage switch is split into at least two switch branches with inputs driven in parallel, said two branches comprising an in-path branch having a switch in the transmission path of such chain and having a conductance ratio F with respect to said driven stage, and a dummy-load branch having a switch with an output conductance which, with the output conductance of said in-path branch switch, comprises a total conductance forming a conductance ration F with respect to a stage switch driving said in-path and dummy-path branches in parallel, said dummy-load branch driving no further switch of said transmission path.

9. The impedance transforming circuit of claim 8 in which said conductance ratio F has a value of two.

10. The impedance transforming circuit of claim 8 in which said output conductances of said in-path, final stage switches of at least some of said transmission paths are different from such conductances of others of said transmission paths.

11. The impedance transforming circuit of claim 10 in which said at least some transmission paths have resistance portions of their in-path, final stage, switch, output impedances scaled in a binarily weighted fashion of decreasing binary weighting for ones of such paths of increasing binary significance.

12. The impedance transforming circuit of claim 11 further comprising;

a plurality of additional ones of said transmission paths, hereafter a plurality of paths, have output impedances with equal resistance portions; and said plurality of paths are divided into at least two groups having binarily weighted numbers of paths in the respective groups whereby the combined parallel resistance portions of final stage, in-path, switch, output impedances of the paths of each group conform to different extensions to said binarily weighted scale.

13. The impedance transforming circuit of claim 8 further comprising in each of said dummy-load branches at least one further switch driven by said dummy-load switch and which drives no further switch in said transmission path, output conductances of said dummy-load switch and said further switch conforming to said ratio F.

* * * * *